(12) United States Patent
You

(10) Patent No.: US 6,806,036 B2
(45) Date of Patent: Oct. 19, 2004

(54) METHOD FOR MANUFACTURING A POLYSILICON TYPE THIN FILM TRANSISTOR

(75) Inventor: Chun-Gi You, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 377 days.

(21) Appl. No.: 09/906,680

(22) Filed: Jul. 18, 2001

(65) Prior Publication Data

US 2002/0106586 A1 Aug. 8, 2002

(30) Foreign Application Priority Data

Nov. 27, 2000 (KR) ........................................ 2000-70976

(51) Int. Cl.[7] ................................................. G03C 5/00
(52) U.S. Cl. ...................... 430/314; 430/313; 430/316; 430/317; 430/318; 430/330
(58) Field of Search ................................. 430/311, 312, 430/313, 314, 315, 316, 317, 318, 319, 322, 323, 324, 325, 330

(56) References Cited

U.S. PATENT DOCUMENTS

| | | | | |
|---|---|---|---|---|
| 5,889,291 A | * | 3/1999 | Koyama et al. | ............... 257/59 |
| 6,329,110 B1 | * | 12/2001 | Nunomura et al. | ........... 430/18 |
| 6,455,875 B2 | * | 9/2002 | Takemura et al. | ............ 257/72 |
| 6,518,102 B1 | * | 2/2003 | Tanaka et al. | .............. 438/143 |

* cited by examiner

Primary Examiner—Saleha R. Mohamedulla
(74) Attorney, Agent, or Firm—McGuireWoods LLP

(57) ABSTRACT

A method for manufacturing a polysilicon type thin film transistor comprises the steps of forming a polysilicon layer on a substrate, forming a gate insulating layer on the polysilicon layer, forming a gate layer on the gate insulating layer, forming a gate pattern by patterning, implanting impurities in the substrate over which the gate pattern is formed, forming a cover layer over the substrate in which impurities are implanted, and thermally annealing the substrate over which the cover layer is formed. In the invention, the thermal annealing is carried out instead of a costly laser annealing after the impurity implantation.

20 Claims, 12 Drawing Sheets

METHOD FOR MANUFACTURING A POLYSILICON TYPE THIN FILM TRANSISTOR

FIELD OF THE INVENTION

The present invention relates to a method for manufacturing polysilicon type thin film transistors, and more particularly to a method for manufacturing polysilicon type thin film transistors using impurity implantation.

BACKGROUND OF THE INVENTION

A thin film transistor liquid crystal display device (TFT-LCD) is a liquid crystal display (LCD) that controls electric fields imparted to pixel electrodes by using a plurality of thin film transistors, each of which is disposed in a pixel. In a polysilicon type TFT-LCD having a polysilicon layer formed in an active region of a glass substrate, carrier mobility at transistor channels is higher than that of an amorphous silicon type TFT-LCD. Accordingly, on the glass substrate of the polysilicon type TFT-LCD, transistor elements of an integrated circuit (IC) for use in a driving circuit can be formed with transistor elements for switching the pixel electrodes. Therefore, the process cost for manufacturing the LCD as well as the electric power operating the LCD can be reduced.

Generally, the driving circuit of the polysilicon type TFT-LCD includes n-type thin film transistors and p-type thin film transistors. Accordingly, in order to form the IC for the driving circuit on the glass substrate, it is necessary to form a plurality of thin film transistors, each of which has different impurity type, which the whole manufacturing process of polysilicon type TFT-LCD.

In addition source/drain electrodes of the polysilicon type TFT LCD are generally formed by a generation implantation or doping. At this time, if a heavily doped implantation is carried out by a high ion energy of more than 90 keV, most of the energy generated by the high ion energy is transformed into heat, which increases the temperature of the glass substrate beyond its limit, thereby stopping the manufacturing process. Also, the photoresist layer may be burnt. In such a case, photoresist is adhered to the glass substrate and cannot be removed by high energy generated by impingement of ions during the ion implantation. The photoresist is generally used as an ion implantation mask. In order to prevent the photoresist burning, a Cr mask may be formed as a subsidiary gate pattern on an Al-contained gate layer, instead of the photoresist ion implantation mask. However, the Cr mask still may not be completely removed after the ion implantation. Also, during the subsequent annealing process, the Cr mask may react with Al of the Al-contained metal gate layer and form pinholes.

When an ion implantation is carried out, an annealing is required to cure the damage done to a polysilicon layer in an active region during the ion implantation and to activate implanted ions to provide TFT elements proper efficiency. Laser equipment is generally used in generating a high temperature in a moment during the annealing. However, since the laser equipment and subsidiary parts are costly articles of consumption, there is a problem that the product cost may increase.

SUMMARY OF THE INVENTION

It is an object of the present invention to provide an improved method for manufacturing polysilicon type thin film transistors that can reduce the product cost by using a thermal annealing instead of a costly laser annealing.

It is another object of the present invention to provide an improved method for manufacturing polysilicon type thin film transistors that can prevent an quality problem such as a photoresist burning during the manufacturing process.

It is another object of the present invention to provide a method for manufacturing polysilicon type thin film transistors that can reduce the number of the manufacturing process without causing a quality problem.

These and other objects are provided, according to the present invention, by a method for manufacturing polysilicon type thin film transistors comprising the steps of forming a polysilicon layer on a substrate, forming a gate insulating layer on the polysilicon layer, forming a gate pattern on the gate insulating layer, forming source/drain regions in the polysilicon layer of the substrate over which the gate pattern is formed, by implanting impurities in the polysilicon layer, forming a cover layer over the substrate over which the gate pattern is formed, and performing a thermal annealing against the substrate over which the cover layer is formed.

The step of forming the gate pattern comprises forming a gate layer on the gate insulating layer, forming a photoresist pattern on the gate layer, and forming a gate pattern and a gate insulating layer pattern by etching the gate layer and the gate insulating layer by using a photoresist pattern as a mask, and the step of forming source/drain regions by implanting impurities uses the photoresist pattern as an ion implantation mask.

In a preferred embodiment of the invention, the cover layer can be formed of a silicon oxide layer or a silicon nitride layer. In case of the silicon oxide layer, the cover layer itself is formed as an interlayer insulating layer and the thermal annealing is carried out at a temperature of 400° C.–500° C. for more than 30 minutes.

Also, in case of the silicon nitride layer, the cover layer is formed to a thickness of 500 Å-5000 Å and the thermal annealing is carried out at a temperature of 400° C.–450° C. for more than 30 minutes.

Alternatively, the thermal annealing can be carried out after forming an intermediate insulating layer on the cover layer, forming contact holes in the interlayer insulating layer, and forming a source/drain electrode layer over the substrate over which the contact holes are formed. The source/drain electrode layer forms data lines. Preferably, the source/drain electrode layer is composed of a double layered structure including a MoW layer as a lower layer, or a triple layered structure including MoW layers as upper and lower layers, rather than a sole Al layer in order to prevent spikes due to the diffusion since the doped polysilicon layer is disposed thereunder.

In the invention, it is preferable that the impurity implantation is carried out by a low energy ion implantation using an ion energy of below 30 keV. Also, a dose during the low energy ion implantation is preferably more than 1.0×1015 ions/cm2. Generally, the low energy ion implantation is carried out directly on the polysilicon layer after removing the gate insulating layer.

In a driving circuit of a TFT-LCD to which the invention is applied, n-type transistors as well as p-type transistors are used. In this case, the step of forming the photoresist pattern, the step of forming the gate pattern and the gate insulating pattern by using the photoresist pattern as a mask, and the stop of forming source/drain regions by using the photoresist pattern as an ion implantation mask are carried out once p-type and n-type transistors are formed respectively. When p-type or n-hype transistors are formed, the other type of transistor regions are protected by the photoresist pattern. Also, the invention includes sub-steps for forming LDD regions and offset regions.

The method of the invention has better effects when using a low energy ion implantation than a general high energy ion implantation. As the high energy ion implantation is substituted with the low energy ion implantation, the dose of impurities can be increased and the required level of annealing lowered since the ion implantation is carried out after the polysilicon layer is exposed by removing a gate insulating layer. Therefore, it is possible to easily carry out a thermal annealing instead of a laser annealing.

DETAILED DESCRIPTION OF PREFERRED EMBODIMENTS

The present invention now will be described more fully hereinafter with reference to the accompanying drawings, in which preferred embodiment of the invention is shown. This invention may, however, be embodied in many different forms and should not be construed as limited to the embodiment set forth herein. Like numbers refer to like elements throughout.

Figure 1:
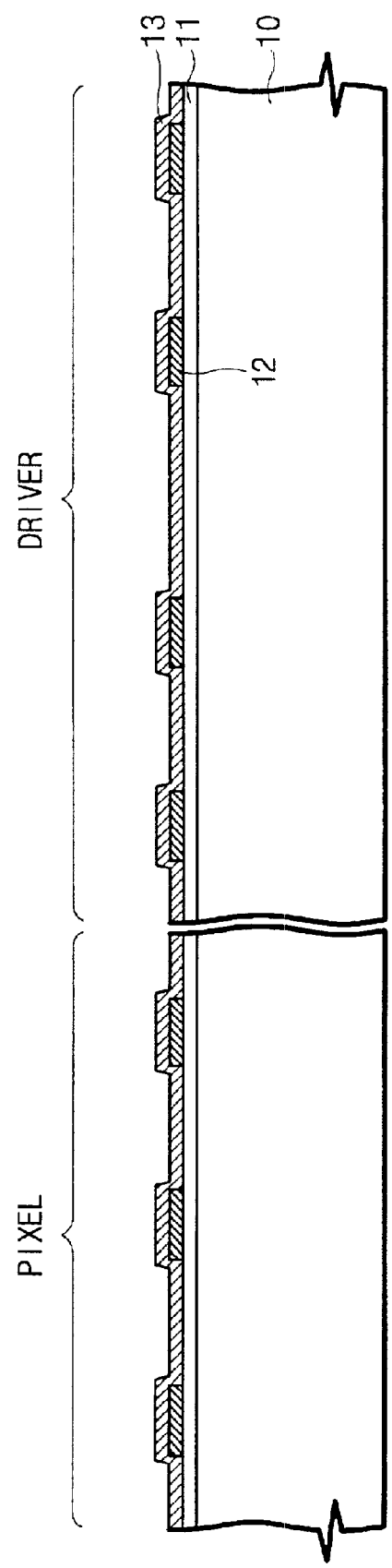
FIG. 1 to FIG. 11 are flow diagrams showing the process steps of a method of manufacturing polysilicon type thin film transistors in accordance with the present invention.

Referring now to FIG. 1, a silicon oxide layer is formed as a blocking layer 11 on a glass substrate 10. Then, a doped amorphous silicon in which n-type impurities are implanted is deposited to a thickness of 800 Å on the blocking layer 11 by a chemical vapor deposition process, and patterned to form a buffer pattern 12. Thereafter, a polysilicon layer 13 is formed to a thickness of 500 Å-800 Å on the buffer pattern 12. In the present invention, the step of forming the blocking layer 11 and the buffer pattern 12 can be usually omitted. The polysilicon layer 13 is formed by a laser annealing after the doped amorphous silicon is deposited on the substrate. Before annealing, the amorphous silicon deposited on the rear surface of the substrate is removed.

Figure 2:
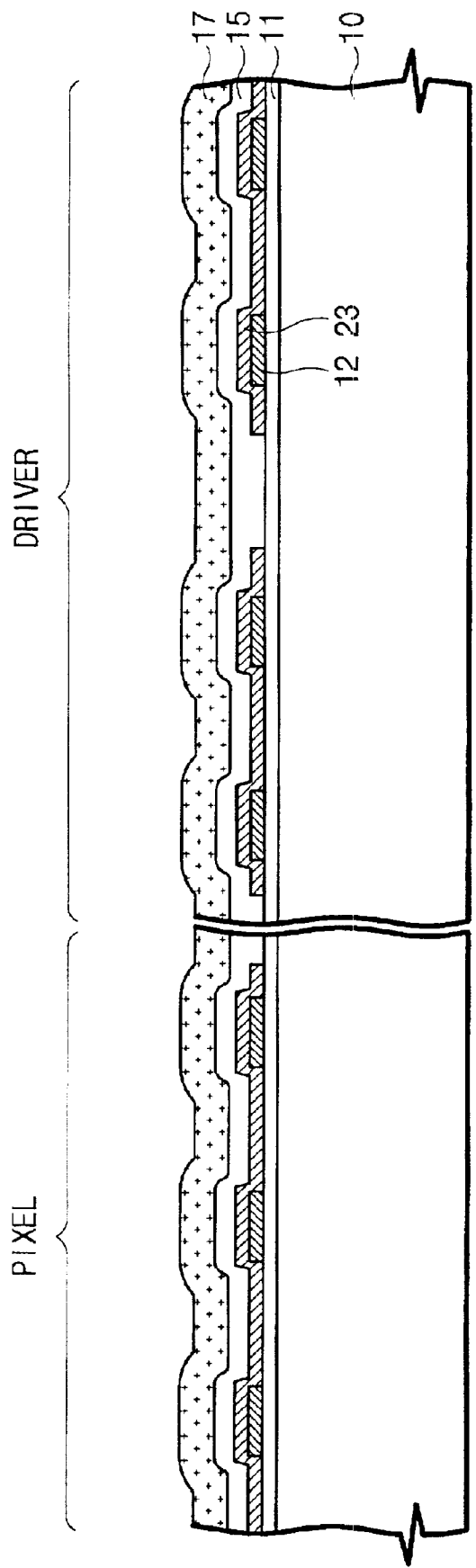

Referring to FIG. 2, a polysilicon layer pattern 23 which forms active regions of thin film transistors is formed over the substrate of FIG. 1 by a photolithography and etching process and then a photoresist pattern used as a mask is removed. Then, a gate insulating layer 15 and a gate layer 17 are formed on the polysilicon layer pattern 23. The gate insulating layer 15 is formed by depositing a silicon oxide to a thickness of 1000 Å, and the gate layer 17 is formed by depositing an AlNd alloy to a thickness of 2000 Å-3000 Å. Generally, the gate layer 17 can be formed of a double layered structure having an Al-contained metal layer and a Mo-contained metal layer, or an Al-contained metal layer and a Cr layer depending on circumstances. In any case, it is preferable to use metal that can provide side walls of a gate pattern 27 forming gentle slopes and can prevent problems in the annealing process, as will be described below.

Figure 3:
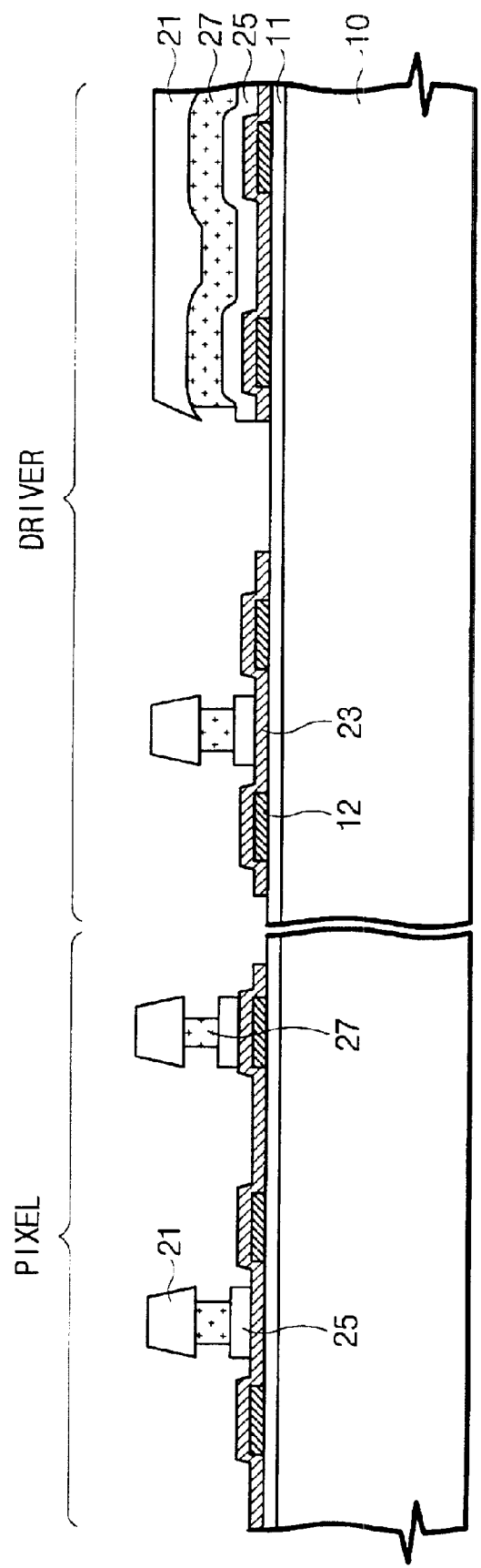

Referring to FIG. 3, the gate pattern 27 is formed at n-type transistor regions on the substrate of FIG. 2 by a photolithography and etching process. During the photolithography and etching process, p-type transistor regions are protected by a photoresist pattern. The photoresist pattern 21 obtained during a developing step of the photolithography process forms its side walls to have a given slope. The gate pattern 27 composed of the gate layer 17 is formed in a shape to have undercuts under the photoresist pattern 21 by an isotropic etch process such as a wet etch process. The width of undercuts is 0.5 μm–1.5 μm.

And then, the gate insulating layer 15 is etched by an anisotropic etch process, so that one pattern element of a gate insulating layer pattern 25 is formed to the same width as that of one pattern element of the photoresist pattern 21. Thus, the width of the gate insulating pattern 25 is larger as much as 0.5 μm–1.5 μm than that of one pattern element of the gate pattern 27 at one side wall thereof. At this time, it is noted that an etch gas having an etch ratio of more than 10:1 is used as an etchant for etching the gate insulating layer 15 to prevent damaging the polysilicon layer pattern 23. An example is a mixture of an Ar gas and a $CHF_3$ gas.

Figure 4:
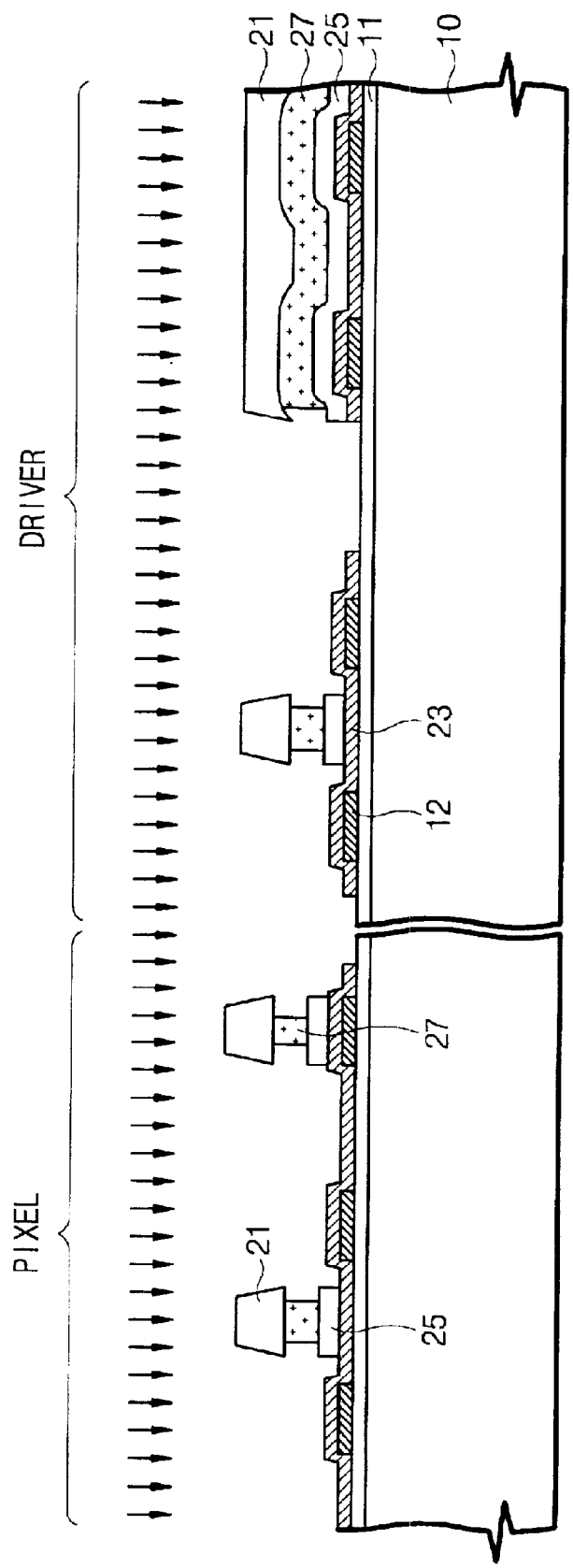

Referring to FIG. 4, a low energy ion implantation is carried out without removing the photoresist pattern 21 from the substrate as shown in FIG. 3. PH3 is usually used as an n-type ion implantation material. The ion implantation is performed by a low ion energy of below 30 keV, preferably 20 keV with a relatively high dose of 1.0×1015 to 5.0×1015 ions/cm2. In a conventional method, an ion implantation is carried out by a high ion energy of about 90 keV with the same dose.

In the present invention, the accelerating voltage during the ion implantation can be reduced, because the gate insulating layer 15 covering source/drain regions of the polysilicon layer is removed by patterning.

Namely, energy irradiated against the polysilicon layer pattern 23 can be reduced since the implanting ions do not have to pass through the gate insulating layer 15. Decreased energy, i.e., the decreased accelerating voltage, reduces heat generated on the substrate. Also, collisions of implanting ions with the photoresist pattern can be reduced, thereby preventing a hardening problem such as a photoresist burning. Also, since there is no gate insulating layer and the ion implantation energy is low so as to increase ionization rate, the number of ions implanted in source/drain regions of the polysilicon layer during the low energy ion implantation increases two to three times than that during the high energy ion implantation with the same dose. Also, decreased amount of ions impinged against the polysilicon layer during the ion implantation can reduce the ion implantation damage.

These effects obtained by carrying out the low energy ion implantation are important. For example, since the number of implanted ions is numerous, source/drains can have good conductivity, so that channel current can be increased. Also, damages due to the ion implantation impingement can be decreased and the required level of the annealing also mitigated, compared to a conventional high energy ion implantation using the same dose.

Because the required level of the annealing is mitigated, the annealing temperature can be lowered reducing its undesirable side effects.

Figure 5:
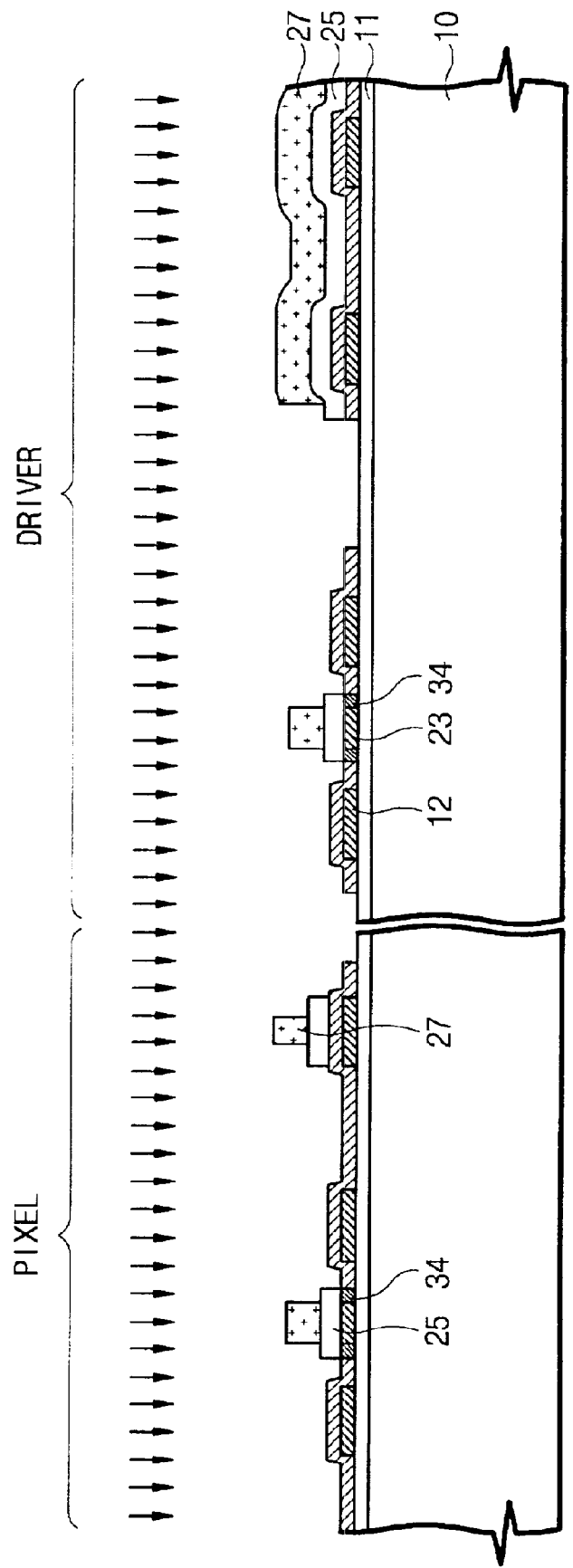

Referring to FIG. 5, lightly doped drains 34 (LDD) are formed in portions of the polisilicon layer pattern 23 which are covered with the gate insulating layer pattern 25 but not covered with the gate pattern 27, by carrying out a low dose and high energy ion implantation after removing the photoresist pattern 21 from the substrate 10 of FIG. 4. At this time, a dose for the ion implantation is 1.0 ×$10^{12}$ions/$cm^2$–

$8.0 \times 10^{12}$ ions/cm² an ion energy is about 90 keV. In this step, the polysilicon layer pattern 23 can be doped by a high energy with no particular problem since it is lightly doped after removing the photoresist pattern 21.

Alternatively, the next step can be performed without carrying out the low dose and high energy ion implantation. In this case, an LDD structure is not formed on n-type thin film transistors, but an offset structure formed.

Also, the LDD structure of the invention can be used only in n-type transistors for driving circuit portions, excluding pixel portions. At this time, additional processes are required to separate the driving circuit portions from the pixel portions.

Figure 6:
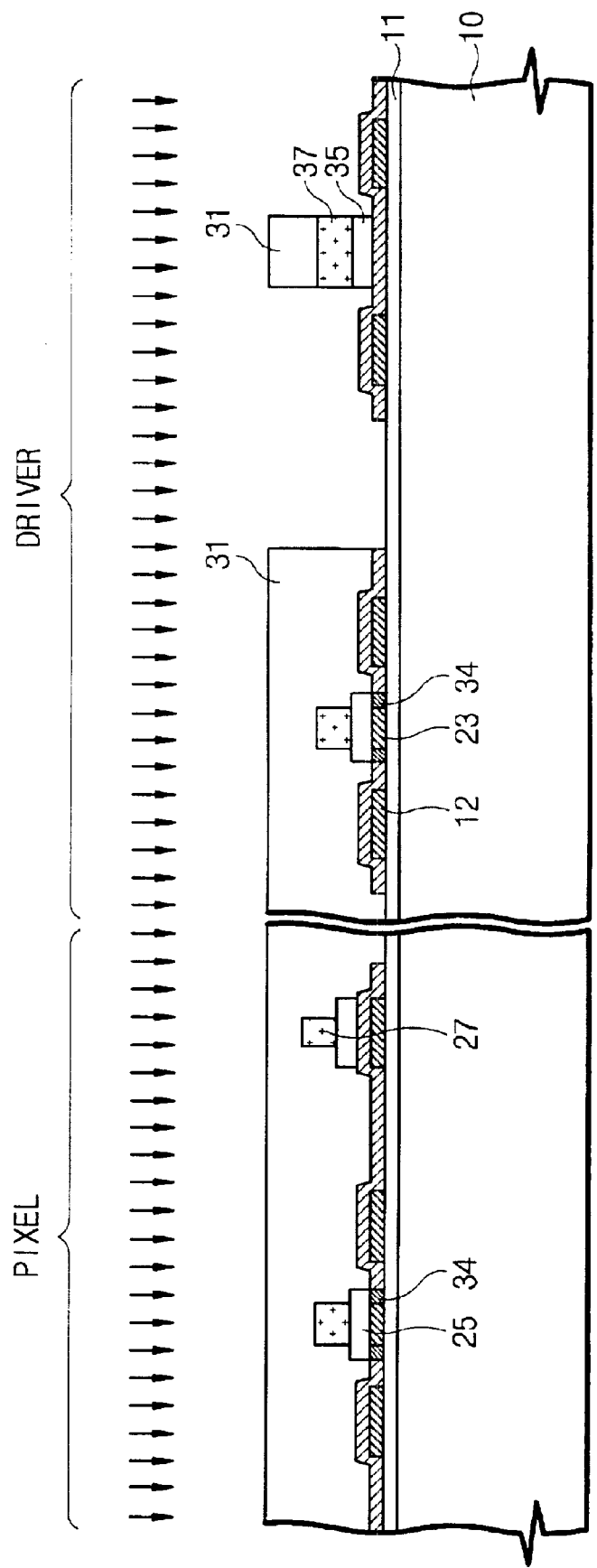

Referring to FIG. 6, a photoresist pattern 31 is formed over the substrate of FIG. 5 by a photolithography process. Then, a gate pattern 37 and a gate insulating layer pattern 35 are formed by partially etching p-type transistor regions. Thereafter, high dose and low energy ion implantation of p-type impurities is carried out. At this time, the gate insulating layer 15 is etched along with the gate layer 17 by an anisotropic etch process since it is not necessary to form the LDD in the pixel portions. During the anisotropic etch process, the n-type transistor regions are protected by the photoresist pattern 31.

A dose and an an ion energy which are used during the p-type ion implantation are the same as those of the n-type high dose and low energy ion implantation. $B_2H_6$ is used as a p-type implantation material.

In the preferred embodiment of the invention, the p-type transistors are formed after the n-type transistors. However, the n-type transistors can be formed first and then the p-type transistors can be formed later.

Figure 7:
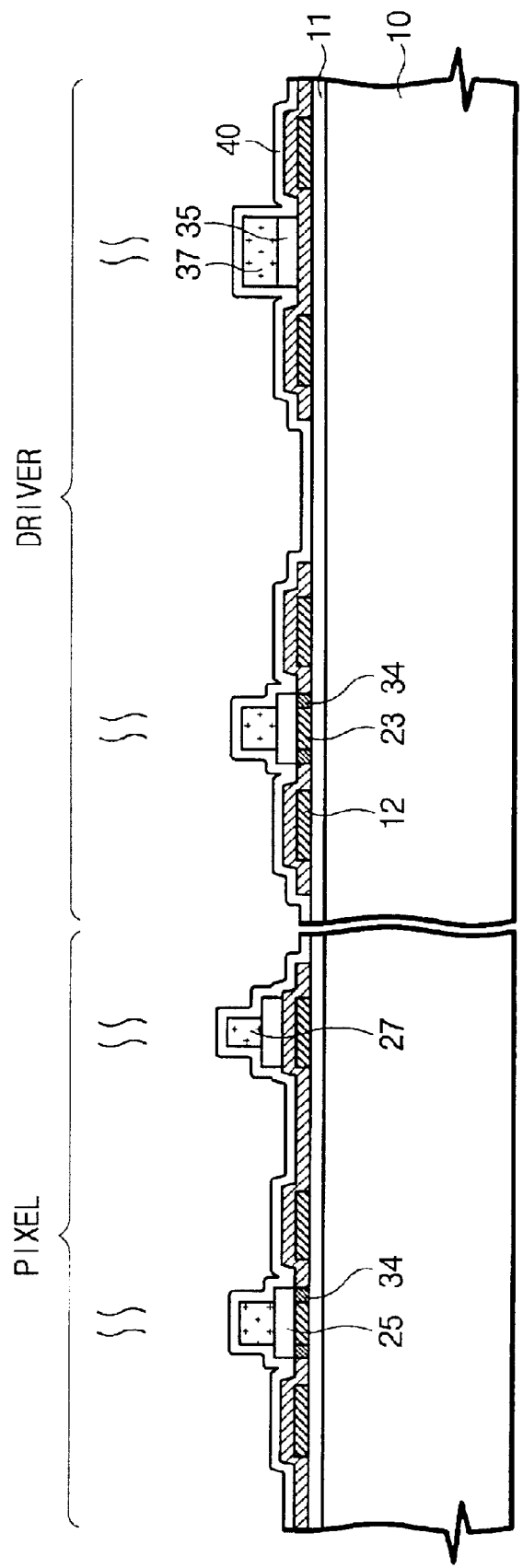

Referring to FIG. 7, the photoresist pattern 31 is removed from the substrate of FIG. 6 by an etch process. Then, a cover layer 40 is formed over the whole surface of the substrate 10. Thereafter, a thermal annealing is carried out. During the thermal annealing, laser equipment is not used, but a general furnace. The cover layer 40 stabilizes the polysilicon layer in the active regions during the thermal annealing.

In order to carry out the annealing, it is possible to use a laser equipment. The laser equipment provides relatively superior annealing effects compared to the preferred embodiment of the invention. However, the steep price for a plurality of laser equipment and accessories may increase the product cost.

Also, the thermal annealing carried out after exposing the polysilicon layer without forming the insulating layer decreases the annealing effect. Also, it is difficult to control and revive the manufacturing process, rendering it impractical to use in a real process.

In the preferred embodiment of the invention, the cover layer 40 uses a silicon nitride layer having a thickness of 500 Å-5000 Å in order to increase channel current. Preferably, the thickness of the cover layer is 1000 Å-2000 Å. When it is too thin, offset surface of the substrate may cause defects. On the other hand, when it is thicker than 8000 Å, thermal stress may cause cracks, thereby resulting in electric leakage of the resultant product. In order to obtain an interlayer insulating layer, it is necessary to additionally form an intermediate insulating layer after annealing. The annealing is carried out at a temperature of 400° C.–450° C. for more than 30 minutes. If a temperature in the furnace is high, an annealing time is reduced, but thermal stress can be easily imparted to the silicon nitride layer. Also, if a temperature in the furnace is low, an annealing time can grow longer, or an annealing can be unsuccessfully carried out. Therefore, it is preferable that the annealing processes be carried out for more than 2 hours in case of 400° C. and for more than 30 minutes in case of 450° C.

Alternatively, the cover layer 40 can be formed of a silicon oxide layer. The silicon oxide layer has poor channel current characteristic compared with those of the silicon nitride layer, but it has advantage in parasitic capacitance since its relative permittivity is low.

Also, an interlayer insulating layer having a thickness of 8000 Å can be formed and annealed at a time without forming an additional insulating layer. Preferably, annealing is carried out at a temperature of 400° C.–500° C. for more than 30 minutes.

Figure 8:
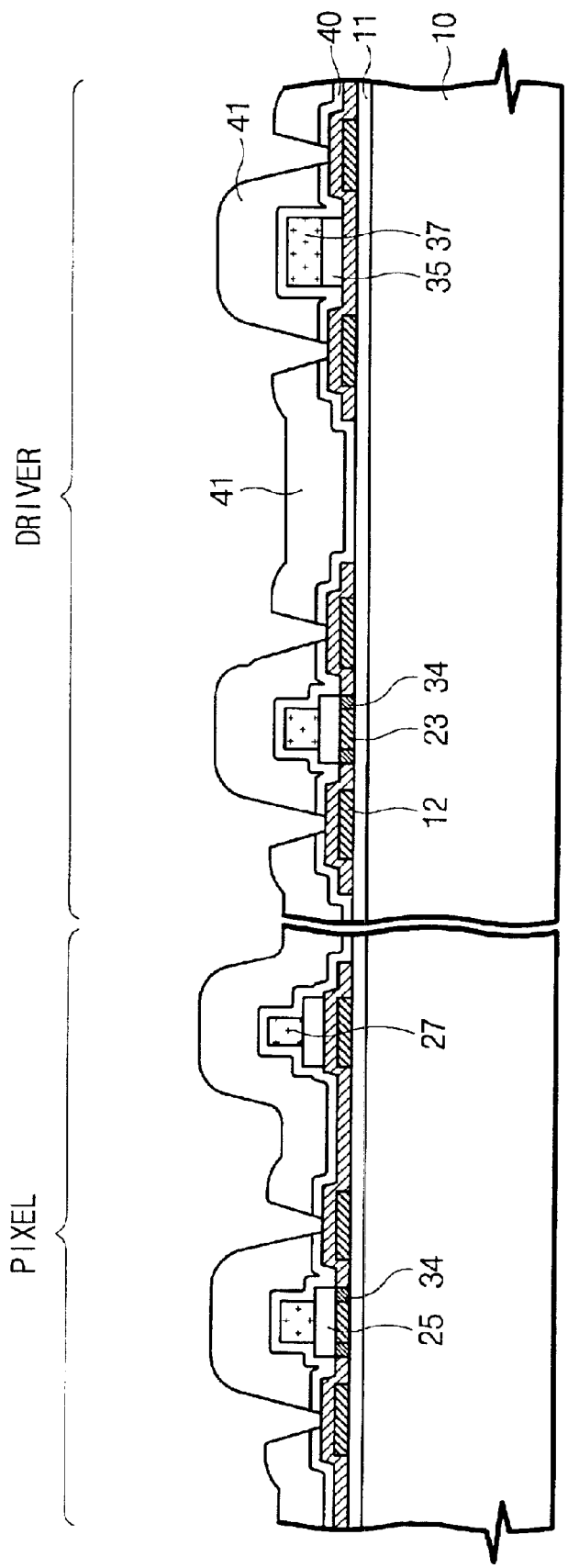

Referring to FIG. 8, an interlayer insulating layer having a double layered structure is formed by further forming an intermediate insulating layer 41 over the substrate of FIG. 7. Then, contact holes are formed by patterning the interlayer insulating layer.

The intermediate insulating layer 41 is formed to a thickness of more than 4000 Å, preferably 6000 Å-8000 Å including a thickness of the cover layer, i.e., a silicon nitride layer formed for annealing. In case the cover layer is a silicon oxide layer, the intermediate insulating layer 41 can be formed to the same thickness. If required, the intermediate insulating layer 41 can be formed of a photo-sensitive organic layer after the thermal annealing. In this case, since there is no need to form a special photoresist pattern for patterning, the manufacturing process can be simplified. Contact holes are formed on the interlayer insulating layer in order to expose the polysilicon layer at source/drain regions of the thin film transistors.

Figure 9:
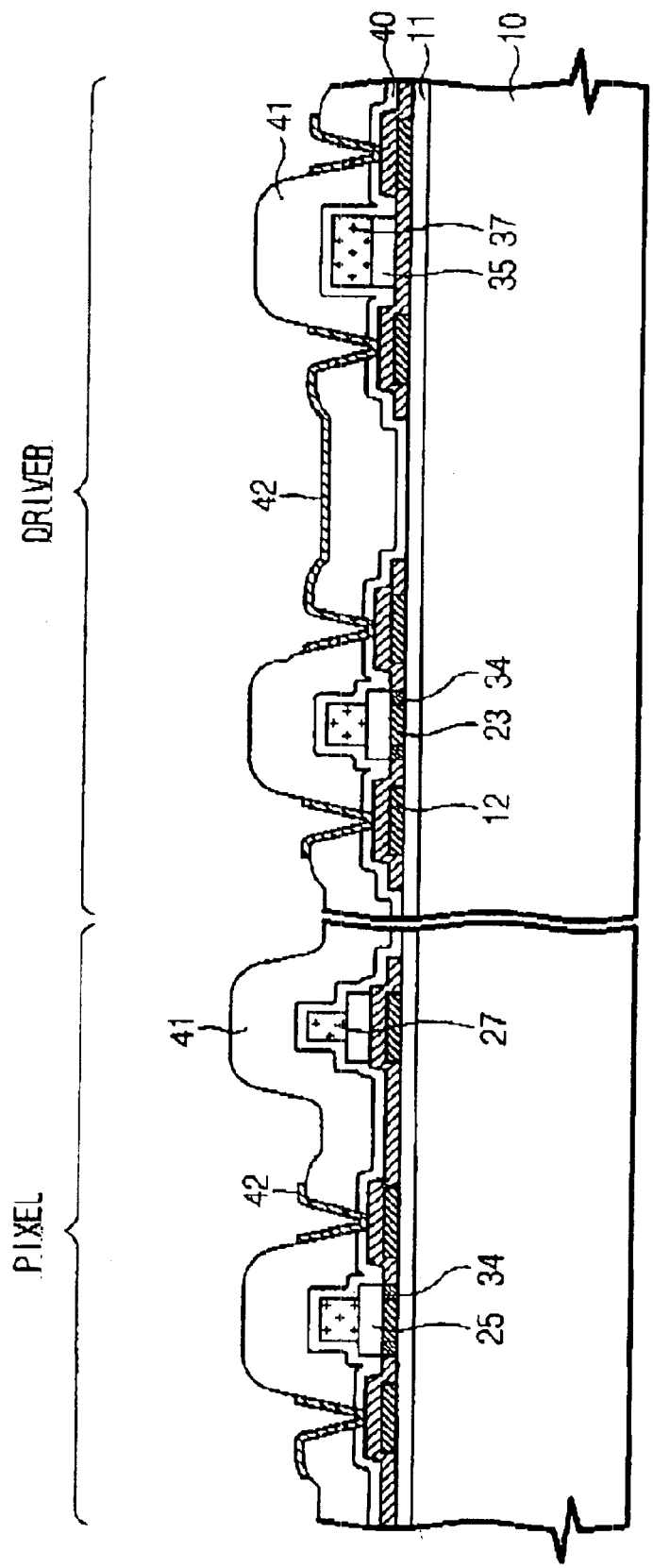

Referring to FIG. 9, a metal layer 42 for contacts and lines is formed over the substrate of FIG. 8. As a result, source/drain electrodes including lines and contacts are formed. The metal layer can be formed a single layered structure composed of an Al-contained metal layer, a double layered structure composed of a MoW alloy layer and an AlNd alloy layer, or a triple layered structure composed of an upper MoW alloy layer, an intermediate AlNd alloy layer and a lower MoW alloy layer.

On the other hand, there are in several cases sheet resistance at boundary surface between the polysilicon layer pattern 23 and the metal layer 42 is large enough to drop supplied voltages, thereby degrading the efficiency of transistors. To reduce the sheet resistance, resistant materials are removed from the boundary surface before the metal layer 42 is formed. At this time, organic material and surface oxide apt to act as a resistant material are removed by respective cleaning process since they have different properties, respectively.

For example, in order to remove oxides, a plasma cleaning is carried out by using a HF gas or a mixed gas including an oxygen and a $CF_4$ gas and then a plasma dry cleaning is carried out by using an Ar gas. In case a HF wet cleaning is carried out in order to increase etch selectivity, the dosed polysilicon layer under contact holes can be lightly worn down, and therefore it can be more easy to omit the buffer layer. At this time, an upper layer of the gate layer 17 is preferably formed of a Mo-contained metal layer that can withstand the HF wet etch process since a portion of an upper surface of the gate pattern 27 disposed in the driving circuit portion can be exposed during the HF wet etch process.

Also, a heat treatment process is carried out at a temperature of 350° C.–450° C. to increase conductivity of contact surface between the polysilicon layer and the metal layer. The heat treatment process can be carried out with a thermal annealing after forming the metal layer 42. In this case, the thermal annealing of the previous step is not carried out.

Figure 10:
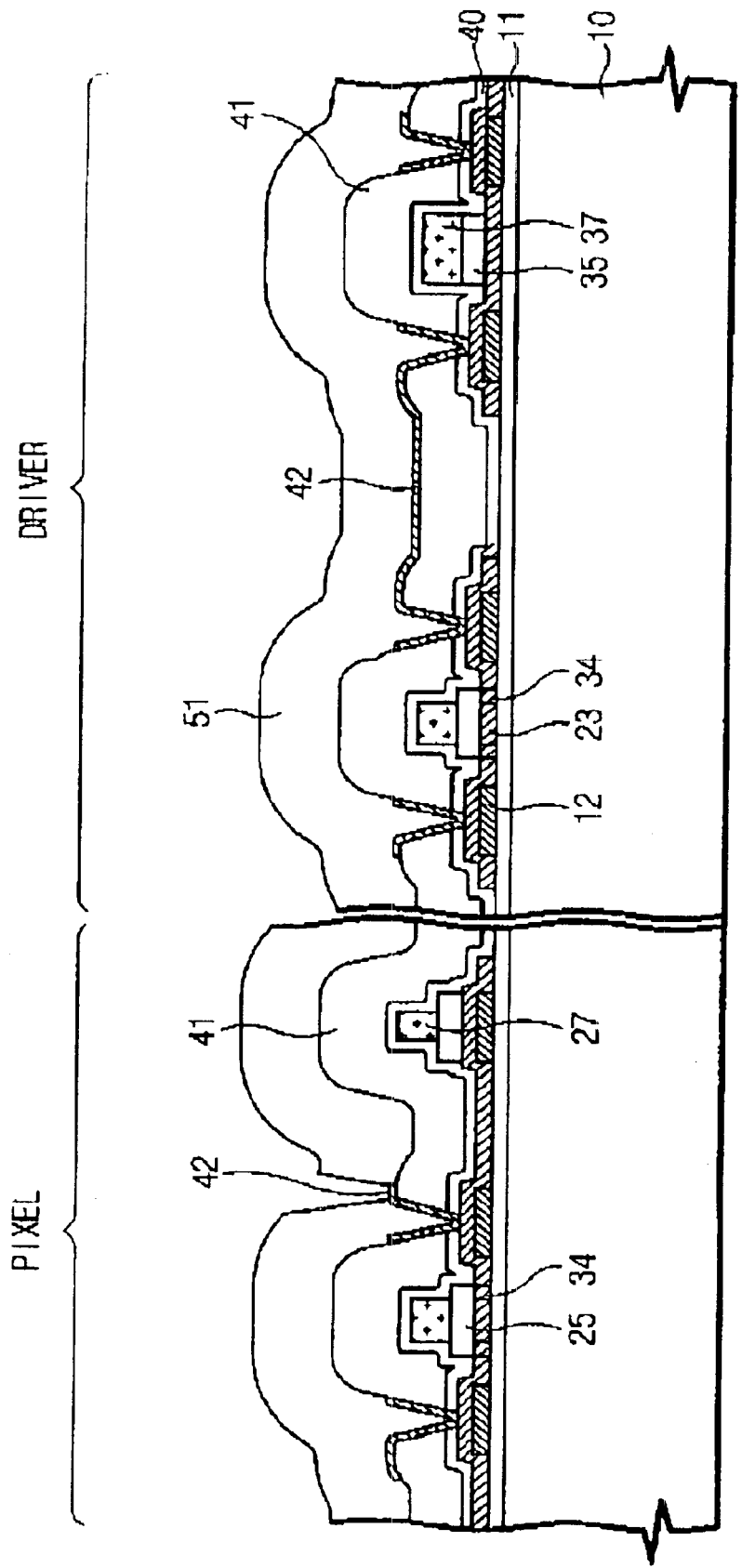

Referring to FIG. 10, a protecting layer 51 is formed over the substrate of FIG. 9 and then patterned to form intermediate holes. An organic or an inorganic layer can be used as a protecting layer 51. For example, a sensitive organic layer is formed to a thickness of 2mm–5 mm, preferably 3 mm. Particularly, in a reflective type or a partial reflective type TFT-LCD, an upper surface of the protecting layer is curved or indented to make it to act as micro lenses.

Figure 11:
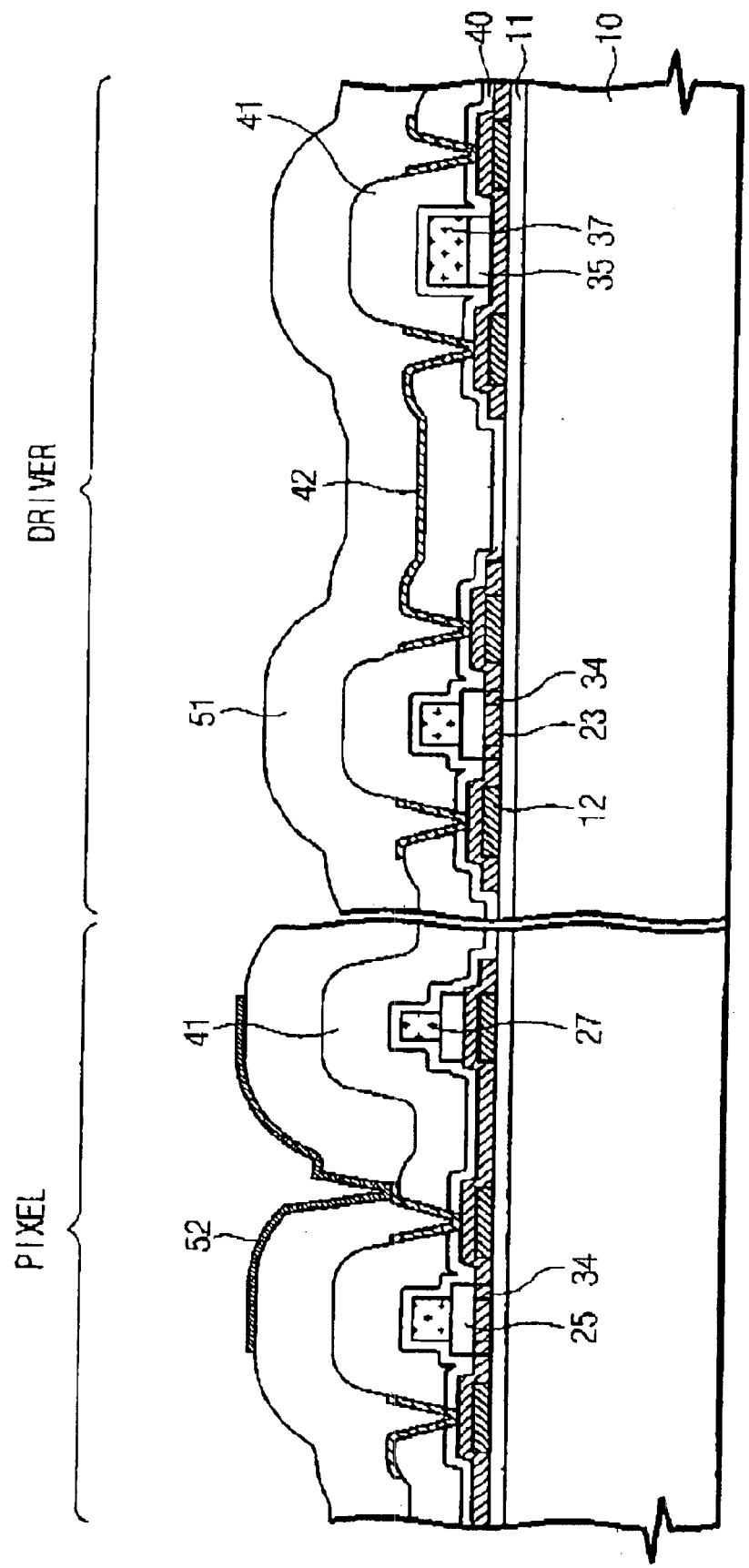

Referring to FIG. 11, a transparent electrode layer is formed at a temperature of 400° C. over the substrate of FIG. 10 and then patterned to form pixel electrodes 52. The transparent electrode layer is usually formed of an indium tin oxide. Also, an indium zinc oxide can be used as material of the transparent electrode layer. In case of the reflective type TFT LCD, the pixel electrode layer is formed of Al, Ag, Al-contained metal, or APC alloy (Ag:Pd:Cu=98:1:1).

Figure 12:
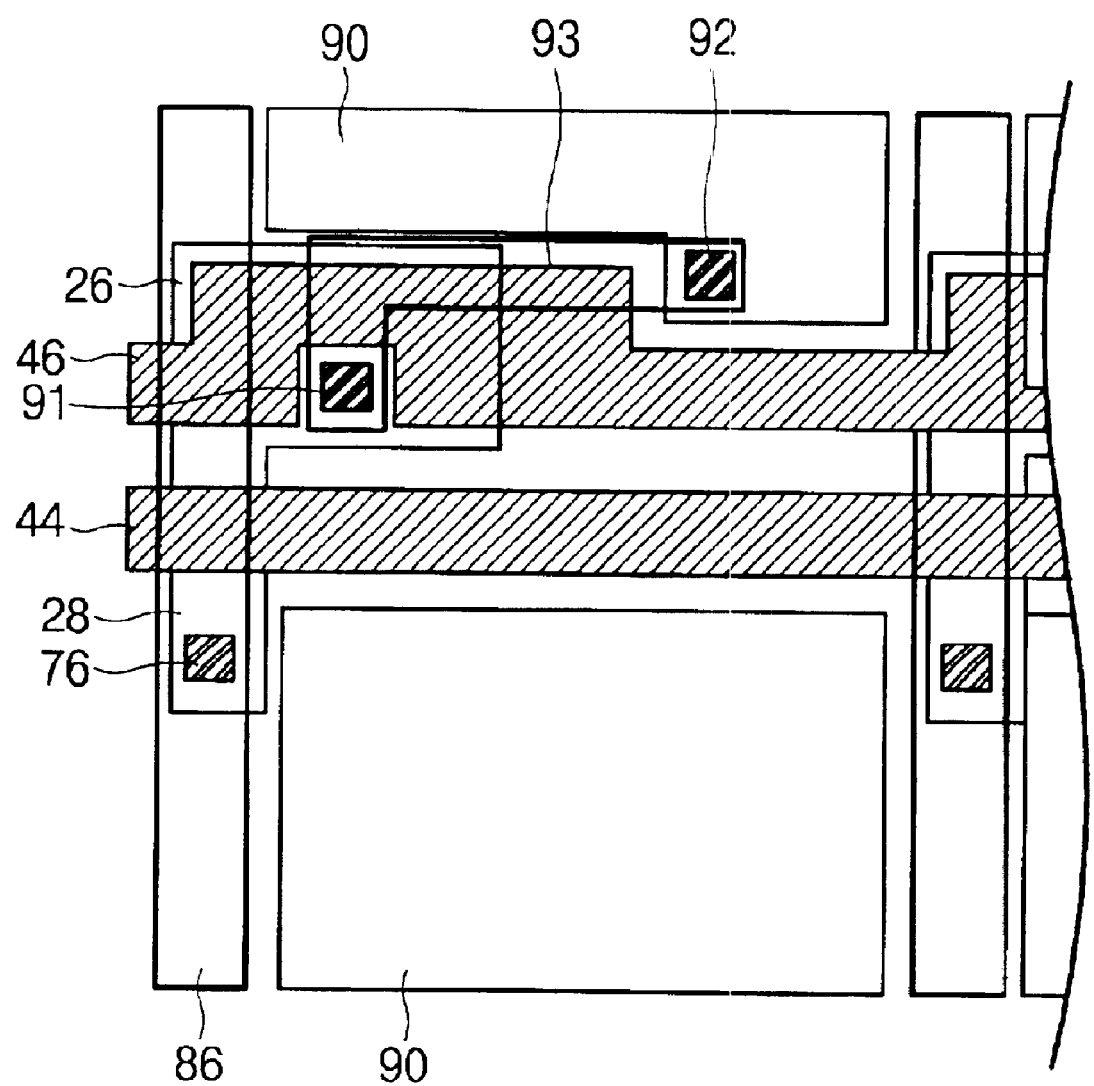
FIG. 12 is a top plan view of a pixel of a polysilicon type thin film transistor LCD manufactured in accordance with the present invention.

FIG. 12 is a top plan view of a pixel of a polysilicon type thin film transistor LCD manufactured by the process steps of FIG. 1 to FIG. 11. LDD regions not shown in FIG. 12 are formed on portions which a gate insulating layer pattern overlaps with an active region, i.e., a polysilicon layer pattern. In a source region 28, a source electrode is connected with a data line 86 through a contact 76, whereas in a drain region 26, a drain electrode is connected with a pixel electrode 90 through a connecting plate 93 and contacts 91, 92. A gate electrode forms a gate line 44 and a subsidiary capacitor electrode which is not illustrated separate from a gate pattern in FIG. 1 to FIG. 11 forms a subsidiary capacitor line 46.

The below Tables 1 and 2 show sheet resistances at an active region of a substrate of a polysilicon TFT LCID manufactured in accordance with the preferred embodiment of the invention. In the polysilicon TFT LCD of Table 1, an ion implantation was carried out by a dose of 1.0×1015 ions/cm² with varying ion energy of the ion implantation.

Thereafter, a silicon oxide layer having a thickness of 1000 Å was formed as a protecting layer and then heat-treated at a temperature of about 450° C. for about one hour. The sheet resistances were measured at six positions that are arbitrarily selected from source/drain regions.

Table 2 shows sheet resistances obtained from the same condition except that a dose during an ion implantation is 3.0×10$^{15}$ ions/cm².

TABLE 1

| | The average resistances ($\Omega/\mu m^2$) at six positions | | | | | | The whole |
|---|---|---|---|---|---|---|---|
| | 1 | 2 | 3 | 4 | 5 | 6 | average |
| 15 keV | 2108 | 2172 | 1950 | 2090 | 2187 | 2197 | 2177 |
| 20 keV | 2755 | 2864 | 2548 | 2747 | 2886 | 2789 | 2765 |
| 25 keV | 12570 | 18370 | 16230 | 18390 | 18350 | 13040 | 16160 |

(Dose: 1.0 × 10$^{15}$ ions/cm²)

TABLE 2

| | The average resistances ($\Omega/\mu m^2$) at six positions | | | | | | The whole |
|---|---|---|---|---|---|---|---|
| | 1 | 2 | 3 | 4 | 5 | 6 | average |
| 15 keV | 1443 | 1475 | 1343 | 1433 | 1487 | 1469 | 1442 |
| 20 keV | 12950 | 16950 | 17860 | 18630 | 15170 | 11200 | 15460 |
| 25 keV | — | — | — | — | — | — | — |

(Dose: 3.0 × 10$^{15}$ ions/cm²)

In table 2, since the measurement of sheet resistances against an ion energy of 20 keV is too high, it is impossible to use it as resistance of contacts. Therefore, it can be appreciated that an ion energy the ion implantation is preferably 15 keV. If a heavily doped ion implantation is carried out by an ion energy of 15 keV, carriers are increased to increase conductivity. However, if a heavily doped ion implantation is carried out by an ion energy accelerating voltage of above 15 keV, crystal damages are increased, so that sheet resistances are increased even if a heat treatment is carried out for a general heat treatment time, for example, one hour. In case a temperature of the heat treatment if 400° C. sheet resistances can be reduced with increasing the time of the heat treatment. However, in this case, it is necessary to use the time longer than the general heat treatment time. Accordingly, it can be appreciated that the heat treatment is preferably carried out at 450° C. for one hour.

As apparent from the foregoing description, it can be appreciated that the present invention provides a method for manufacturing polysilicon type thin film transistors that can reduce the product cost by reducing use of costly articles of consumption such as a plurality of laser equipment and subsidiary parts.

Also, the present invention provides an improved method for manufacturing polysilicon type thin film transistors that can omit the step of forming a buffer layer which functions to increase the reliability of contacts between a polysilicon layer and a metal layer, thereby reducing the number of manufacturing process.

In the drawings and specification, there has been disclosed typical preferred embodiment of the invention and, although specific terms are employed, they are used in a generic and descriptive sense only and not for purpose of limitation, the scope of the invention being set forth in the following claims.

What is claimed is:

1. A method for manufacturing a polysilicon type thin film transistor, comprising steps of:

forming a polysilicon layer on a substrate;
   forming a gate insulating layer on the polysilicon layer;
   forming a photoresist layer;
   forming a gate pattern on the gate insulating layer;
   forming a gate insulating layer pattern;
   implanting impurities using the photoresist layer, the gate pattern and the gate insulating layer pattern as a mask to form source/drain regions;
   forming a rover layer; and
   annealing the substrate thermally.

2. The method for manufacturing a polysilicon type thin film transistor according to claim 1, wherein the cover layer is formed of a silicon oxide layer.

3. The method for manufacturing a polysilicon type thin film transistor according to claim 2, wherein the cover layer is formed to a thickness of 500 Å–8000 Å and the substrate is annealed thermally at a temperature of 400° C.–500° C. for more than 30 minutes.

4. The method for manufacturing a polysilicon type thin film transistor according to claim 2, further comprising a step of forming an interlayer insulating layer having a thickness more than 4000 Å.

5. The method for manufacturing a polysilicon type thin film transistor according to claim 4, wherein the substrate is thermally annealed at a temperature of 400° C.–500° C. for more than 30 minutes right after the cover layer is formed and right before the interlayer insulating layer is formed.

6. The method for manufacturing a polysilicon type thin film transistor according to claim 1, wherein the cover layer is formed of a silicon nitride layer.

7. The method for manufacturing a polysilicon type thin film transistor according to claim 6, wherein the cover layer is formed to a thickness of 500–5000 Å and the substrate is annealed at a temperature of 400° C.–450° C. for more than 30 minutes.

8. The method for manufacturing a polysilicon type thin film transistor according to claim 6, further comprising a step of forming an interlayer insulating layer having a thickness more than 4000 Å.

9. The method for manufacturing a polysilicon type thin film transistor according to claim 8, wherein the substrate is thermally annealed at a temperature of 400° C.–500° C. for more than 30 minutes right after the cover layer is formed and right before the interlayer insulating layer is formed.

10. The method for manufacturing a polysilicon type thin film transistor according to claim 1, wherein said thermal annealing is carried out after:
   forming an interlayer insulating layer by additionally forming an intermediate insulating layer on said cover layer;
   forming contact holes in said interlayer insulating layer; and
   forming a source/drain electrode layer over said substrate over which said contact holes are formed.

11. The method for manufacturing a polysilicon type thin film transistor according to claim 1, further including steps of:
   forming an interlayer insulating layer of a photo-sensitive organic layer on the cover layer;
   forming contact holes in the interlayer insulating layer; forming a source/drain electrode through the contact holes.

12. The method for manufacturing a polysilicon type thin film transistor according to claim 1, wherein the impurities are implanted by an ion implantation using an ion energy of below 30 keV.

13. The method for manufacturing a polysilicon type thin film transistor according to claim 1, wherein the impurities are implanted by an ion implantation with a dose of more than $1.0 \times 10^{15}$ ions/cm$^2$.

14. The method for manufacturing a polysilicon type thin film transistor according to claim 1, wherein one type of transistor area is covered by a photoresist layer pattern when another type of transistor area is implanted with impurities.

15. The method for manufacturing a polysilicon type thin film transistor according to claim 10, wherein the gate pattern is formed by an isotropic etch process that can form undercuts when the gate pattern is formed in n-type transistor regions and further including a step of forming portions of an active region corresponding to the undercuts as LDD regions by an ion implantation using relatively low dose compared with the impurity implantation, after the impurity implantation is carried out by a low energy ion implantation of below 30 kV.

16. The method for manufacturing a polysilicon type thin film transistor according to claim 1, further including a step of forming a buffer pattern of a doped amorphous silicon on the substrate before forming the polysilicon layer.

17. The method for manufacturing a polysilicon type thin film transistor according to claim 1, further including steps of:
   forming contact holes by patterning the cover layer so as to expose the source/drain regions after the substrate is thermally annealed;
   forming a metal layer to form contacts, and source electrodes;
   forming a protecting layer and forming contact holes to expose the source electrodes composed of the metal layer; and
   forming a pixel electrode.

18. The method for manufacturing a polysilicon type thin film transistor according to claim 17, wherein the protecting layer is formed to a thickness of 2 $\mu$m–5 $\mu$3.

19. The method for manufacturing a polysilicon type thin film transistor according to claim 17, wherein micro lenses are formed on the protecting layer by curving or indenting an upper surface thereof.

20. The method for manufacturing a polysilicon type thin film transistor according to claim 18, wherein the pixel electrode is formed of one metal selected from indium tin oxide, indium zinc oxide, aluminum, aluminum alloy, silver, and silver alloy.

* * * * *